(12) United States Patent
Verma et al.

(10) Patent No.: US 11,829,700 B2
(45) Date of Patent: *Nov. 28, 2023

(54) METHOD OF ANALYZING AND DETECTING CRITICAL CELLS

(71) Applicant: TAIWAN SEMICONDUCTOR MANUFACTURING COMPANY, LTD., Hsinchu (TW)

(72) Inventors: Anurag Verma, Hsinchu (TW); Meng-Kai Hsu, Hsinchu (TW); Chih-Wei Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/690,990

(22) Filed: Mar. 9, 2022

(65) Prior Publication Data

US 2022/0198121 A1 Jun. 23, 2022

Related U.S. Application Data

(63) Continuation of application No. 17/025,449, filed on Sep. 18, 2020, now Pat. No. 11,288,436.

(Continued)

(51) Int. Cl.
*G06F 30/398* (2020.01)

(52) U.S. Cl.
CPC .................................. *G06F 30/398* (2020.01)

(58) Field of Classification Search
CPC ...... G06F 30/392; G06F 30/394; G06F 15/76; G06F 15/7825; G06F 8/314; G06F 8/33; G06F 8/41; G06F 8/427; G06F 8/443; G06F 8/4434; G06F 8/445; G06F 8/447; G06F 8/451; G06F 8/70; G06F 9/30145; G06F 16/29; G06F 16/58; G06F 16/5838; G06F 16/9535; G06F 16/9537; G06F 16/9554; G06F 3/0482; G06F 16/5866; G06F 3/04842; G06F 30/398; G06F 30/327; G06F 30/331; G06F 30/39; G06F 21/316; G06F 21/32; G06F 21/55; G06F 2115/10; G06F 9/5066; G06F 2119/12; G06F 30/3312; G06F 30/30; G06F 2115/08; G06F 16/221; G06F 16/2282; G06F 16/2379; G06F 16/24573; G06F 16/248; G06F 16/252; G06F 16/287; G06F 21/6218; G06F 21/6227; G06F 3/0484; G06F 3/04847;

(Continued)

(56) References Cited

U.S. PATENT DOCUMENTS 7,260,442 B2   8/2007   Hwang et al.
9,256,709 B2   2/2016   Yu et al.

(Continued)

*Primary Examiner* — Binh C Tat
(74) *Attorney, Agent, or Firm* — Hauptman Ham, LLP

(57) ABSTRACT

A method includes clustering cells in a group of cells into a selected number of clusters, and ranking the clusters based on a list of prioritized features to generate a list of ranked clusters. The method also includes ranking cells in each of one or more ranked clusters in the list of ranked clusters, based on the list of prioritized features, to generate a list of ranked critical cells. The method further includes outputting the list of ranked critical cells for use in adjusting cell layouts based on the ranked critical cells.

20 Claims, 13 Drawing Sheets

Related U.S. Application Data

(60) Provisional application No. 62/968,017, filed on Jan. 30, 2020.

(58) Field of Classification Search
CPC ...... G06F 40/174; G06F 40/177; G06F 40/18; G06F 40/186; G06F 8/65; G06F 30/33; G06F 18/40; G06F 18/00; G06F 3/04817; G06F 16/26; G06F 21/31; G06F 2119/18; G06F 30/3323; G06F 7/14; G06F 2203/04806; G06F 2203/04808; G06F 3/0483; G06F 3/04845; G06F 3/04883; G06F 2119/06; G06F 30/3308; G06F 30/3947; H01L 27/11807; H01L 27/1104; H01L 23/528; H01L 27/0207; H01L 27/0922; H01L 23/5222; H01L 2924/1431; H01L 2924/15311; G03F 1/36; G03F 7/705; G03F 7/70508; G03F 7/70541; G03F 7/70641; G03F 7/7065; G03F 9/7026; G03F 7/70091; G03F 7/70141; G03F 7/70258; G03F 7/706; G03F 7/70625; G03F 7/70633; G03F 7/70866
USPC .................................. 716/100–106, 136–139
See application file for complete search history.

(56) References Cited

U.S. PATENT DOCUMENTS

| | | | |
|---|---|---|---|
| 11,288,436 B2* | 3/2022 | Verma | G06F 30/398 |
| 2006/0031804 A1 | 2/2006 | Alpert et al. | |
| 2009/0193377 A1 | 7/2009 | Puri et al. | |
| 2014/0040838 A1 | 2/2014 | Liu et al. | |
| 2015/0067616 A1* | 3/2015 | Hsu | G06F 30/39 |
| | | | 716/52 |
| 2015/0278429 A1 | 10/2015 | Chang | |
| 2016/0085898 A1* | 3/2016 | Manohar | G06F 30/392 |
| | | | 716/124 |
| 2017/0228485 A1 | 8/2017 | Xu et al. | |

* cited by examiner

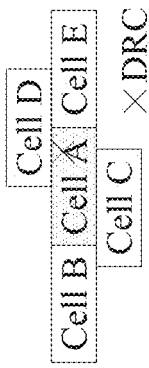
FIG. 2A — Top of DRC
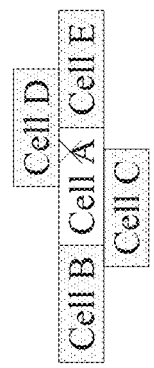
FIG. 2B — Neighbor to DRC
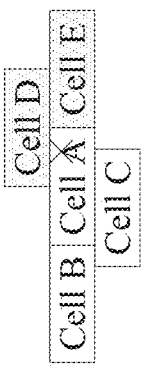
FIG. 2C — Edge to DRC

| Priority | Category | Number of Features | Feature | Feature List |
|---|---|---|---|---|
| 1 | DRC features | 3 | On-top DRC markers | F[1] |
| | | | Adjacent to DRC markers | F[2] |
| | | | Nearest neighbor to DRC markers | F[3] |
| 2 | Pin density features | 9 | $90 < X \leq 100\%$ bin | F[4] |
| | | | $80 < X \leq 90\%$ bin | F[5] |
| | | | $70 < X \leq 80\%$ bin | F[6] |
| | | | $60 < X \leq 70\%$ bin | F[7] |
| | | | $50 < X \leq 60\%$ bin | F[8] |
| | | | $40 < X \leq 50\%$ bin | F[9] |
| | | | $30 < X \leq 40\%$ bin | F[10] |
| | | | $20 < X \leq 30\%$ bin | F[11] |
| | | | $0 < X \leq 20\%$ bin | F[12] |
| 3 | Placement density features | 9 | $90 < X \leq 100\%$ bin | F[13] |
| | | | $80 < X \leq 90\%$ bin | F[14] |
| | | | $70 < X \leq 80\%$ bin | F[15] |
| | | | $60 < X \leq 70\%$ bin | F[16] |
| | | | $50 < X \leq 60\%$ bin | F[17] |
| | | | $40 < X \leq 50\%$ bin | F[18] |
| | | | $30 < X \leq 40\%$ bin | F[19] |
| | | | $20 < X \leq 30\%$ bin | F[20] |
| | | | $0 < X \leq 20\%$ bin | F[21] |
| 4 | Usage related features | 2 | Cell Usage by area (%) | F[22] |
| | | | Cell Usage by count (%) | F[23] |
| 5 | Cell intrinsic features | 2 | Individual cell pin density | F[24] |
| | | | Individual cell pin count | F[25] |

FIG. 3

| Score | 1st Priority Feature | 2nd Priority Feature | 3rd Priority Feature | 4th | 5th | 6th |
|---|---|---|---|---|---|---|
| Cell A | 10 (1st) | 5 | 6 | | | |
| Cell B | 8 | 2 (3rd) | 7 | | | |
| Cell C | 8 | 6 (2nd) | 3 | | | |
| Cell D | 4 | 8 | 6 (4th) | | | |
| Cell E | 4 | 8 | 4 (5th) | | | |
| Cell F | 4 | 7 (6th) | 9 | | | |

METHOD OF ANALYZING AND DETECTING CRITICAL CELLS

PRIORITY CLAIM

The present application is a continuation of U.S. application Ser. No. 17/025,449, filed Sep. 18, 2020, now U.S. Pat. No. 11,288,436, issued on Mar. 29, 2022, which claims the priority of U.S. Provisional Application No. 62/968,017, filed Jan. 30, 2020, each of which is incorporated herein by reference in its entirety.

BACKGROUND

Automated Place and Route (APR) tools are often used to perform the routing designs in integrated circuit (IC) layout. These tools optimize the power, performance and area while making sure that technology and design constraints are followed. The technology constraints involved depend on the limitations of the manufacturing process and hard constraints. Constraint violations, such as by illegal routing patterns, lead to Design Rule Check violations (DRC violations). In normal place and route (PnR) flows used in the semiconductor industry, after a few iterations of routing, the DRCs in the design are analyzed and the root cause(s) are identified.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a schematic diagram of a cell arrangement, in accordance with some embodiments.

FIG. 2B is a schematic diagram of a cell arrangement, in accordance with some embodiments.

FIG. 2C is a schematic diagram of a cell arrangement, in accordance with some embodiments.

FIG. 3 is a table of a set of features for characterizing a group of cells, in accordance with some embodiments.

FIG. 6B is a table listing the score values of cells, in accordance with some embodiments.

DETAILED DESCRIPTION

Figure 1:
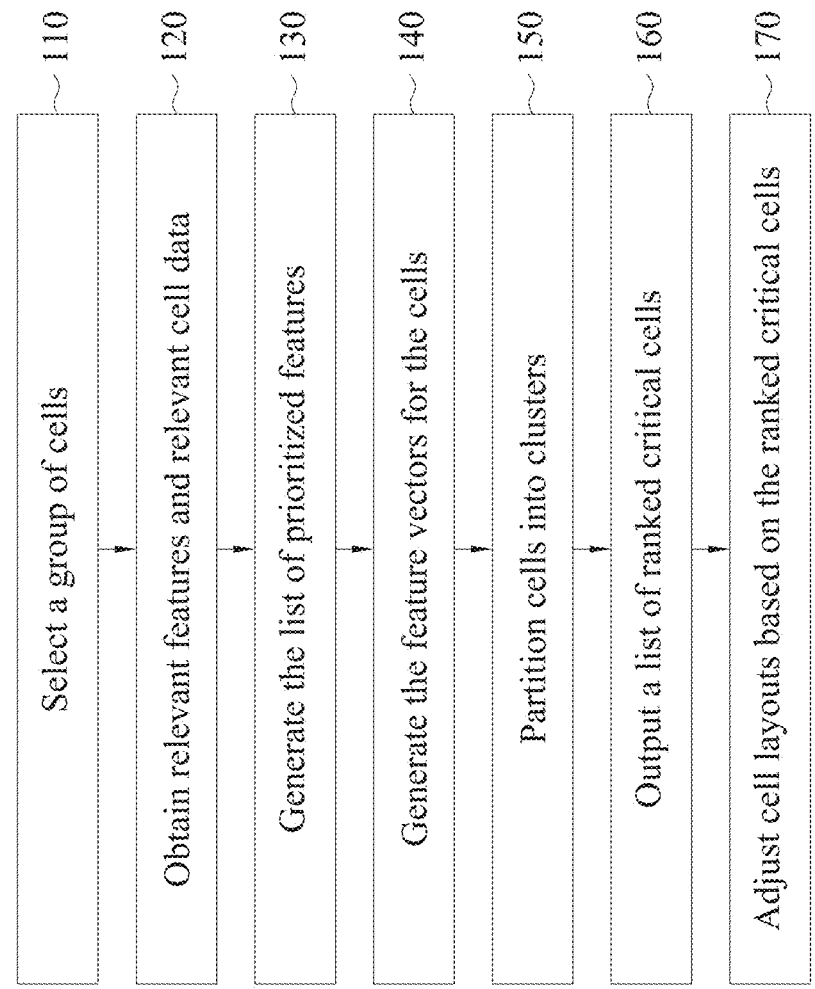
FIG. 1 is a flowchart of a method of detecting critical cells in layout designs, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method of detecting critical cells in layout designs of integrated circuits, in accordance with some embodiments. At process 110, a group of cells is selected. In some embodiments, the group of cells is selected from an Auto Place and Route (APR) database in which Design Rule Check (DRC) violations are identified for at least a portion of cells in the APR database. The number of DRC violations in the chosen APR database, for using in the process of detecting critical cells, is large enough so that it is sufficient for detecting all of the critical cells or detecting at least a majority of the critical cells. At the same time, the number of DRC violations is not too large as to complicate the analytical process for detecting critical cells. In some embodiments, the number of DRC violations is in a range from 100 to 1500.

After the group of cells is selected, the method proceeds to a process 120 in which relevant features and relevant cell data are obtained. The process 120 includes finding a set of features for characterizing the group of cells. In some embodiments, the set of features includes one or more DRC features, such as, the feature of on-top DRC markers (count of cell instances located at position of DRC marker), the feature of adjacent-to DRC markers (count of cell instances located adjacent to another type of cell at position of DRC marker), and the feature of nearest-neighbor-to DRC markers (count of cell instances located at nearest horizontal/ vertical edge of another type of cell at position of DRC marker). DRC markers indicate locations of DRC violations in a layout.

FIG. 2A is a schematic diagram of a cell arrangement related to the feature of on-top DRC markers, in accordance with some embodiments. The feature of on-top DRC markers is the number of times an instance of cell of interest falls directly on top of a DRC marker. In other words, the DRC violation as identified by the DRC marker is within the boundaries of cell of interest. In some embodiments, the feature of on-top DRC markers for characterizing a cell of interest is associated with a corresponding counting variable for the cell of interest. In FIG. 2A, as a score value assigned to the feature of on-top DRC markers, the corresponding counting variable for cell A is incremented for the DRC marker shown as "X," because cell A lies directly on top of the marker "X." While the score value assigned to the feature of on-top DRC markers for cell A is increased by one count because of the DRC marker "X" being within boundaries of cell A, the score value assigned to the feature of on-top DRC markers for each of cells B, C, D, and E is not changed by the presence of the DRC marker "X" being within boundaries of cell A.

FIG. 2B is a schematic diagram of a cell arrangement related to the feature of adjacent-to DRC markers, in accordance with some embodiments. The feature of adjacent-to DRC markers is the number of times an instance of cell of interest is adjacent to another cell whose boundary encloses a DRC marker. In some embodiments, the feature of adjacent-to DRC markers for characterizing a given cell is associated with a corresponding score value which is a corresponding counting variable for the given cell. In FIG. 2B, as a score value assigned to the feature of adjacent-to DRC markers, the corresponding counting variable for each of cells B, C, D, and E is incremented because of the DRC marker shown as "X," because each of cells B, C, D, and E is a neighbor of cell A which is on top of the DRC marker "X." While the score value assigned to the feature of adjacent-to DRC markers for each of cells B, C, D, and E is increased by one count because of the DRC marker "X" in the neighbor cell A, the score value assigned to the feature of adjacent-to DRC markers for cell A is not changed by the presence of the DRC marker "X" in cell A.

FIG. 2C is a schematic diagram of a cell arrangement related to the feature of nearest-neighbor-to DRC markers, in accordance with some embodiments. The feature of nearest-neighbor-to DRC markers is the number of times an instance of cell of interest is adjacent to another cell whose boundary encloses a DRC marker, at the horizontal or vertical edge that is closest to the DRC marker. In some embodiments, the feature of nearest-neighbor-to DRC markers for characterizing a given cell is associated with a corresponding counting variable for the given cell. In FIG. 2C, as a score value is assigned to the feature of nearest neighbor to DRC markers, the corresponding counting variable for each of cells D and E is incremented because of the DRC marker shown as "X," because each of cells D and E is a neighbor to the cell which is on top of the DRC marker, at either the horizontal or vertical edge which is closest to the DRC marker "X." While the score value assigned to the feature of nearest-neighbor-to DRC markers for each of cells D and E is increased by one count because the DRC marker "X" in the neighbor cell A is close to one of the edges of cells D or E, the score value assigned to the feature of nearest-neighbor-to DRC markers for each of cells A, B, and C is not changed by the presence of the DRC marker "X" in cell A.

In some embodiments of the process in FIG. 1, the set of features for characterizing a group of cells includes one or more pin density features. The pin density features provide information about whether DRC violations are correlated with the placement of a cell in high pin density regions of the design. In some embodiments, the pin density features for characterizing a given cell are related to a distribution of the given cell among regions of various pin densities in the design. In some embodiments, for generating a pin density distribution of a given cell, regions of the design with various pin densities is selected for counting the numbers of the given cell in each region. Additionally, multiple bins each representing a range of pin densities are selected to summarize the counted number of the given cell in various regions. In some embodiments, the pin density in a region is calculated as the ratio between the number of pins in the region and the number of core site available in the region, while the number of core site available in the region is calculated as the ratio between the query area of the region and the area occupied by one core site. The number of core sites available in the region provides the maximal number of pins that are possibly implemented in the region, and thus a 100% pin density corresponds to a region in which all core sites available are occupied with pins.

Figures 2D, 2E:
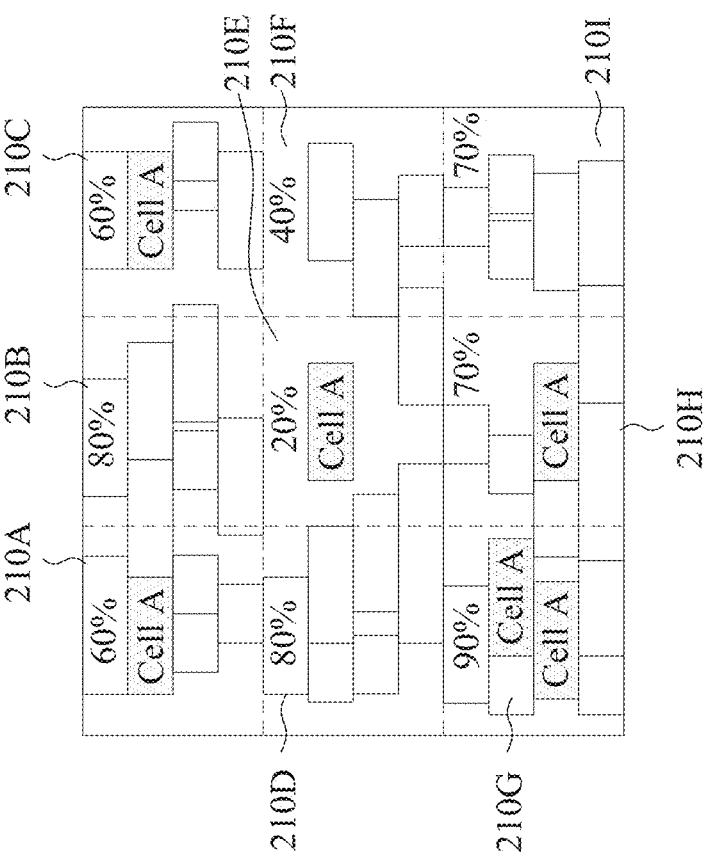
FIG. 2D is a schematic diagram of a layout section, in accordance with some embodiments.
FIG. 2E is a table of the counted numbers of a chosen cell in of the layout section of FIG. 2D, in accordance with some embodiments.

For example, in FIG. 2D, a group of nine regions (e.g., 210A, 210B, 210C, 210D, 210E, 210F, 210G, 210H, 210I) is selected for counting the numbers of cell A in each region. There is one cell A in each of the regions 210A, 210C, 210E, and 210H. There are two of cell A in region 210G. There is no cell A in each of the regions 210B, 210D, 210F, and 210I. The regions 210A, 210B, and 210C have corresponding pin densities of 60%, 80%, and 60%. The regions 210D, 210E, and 210F have corresponding pin densities of 60%, 20%, and 40%. The regions 210G, 210H, and 210I have corresponding pin densities of 90%, 70%, and 70%.

The counted number of cell A in various regions of FIG. 2D are summarized in FIG. 2E. In the table of FIG. 2E, the first column lists nine bins each representing a range of pin densities, while the second column in the table lists the corresponding counted number of cell A in each of the nine bins. There is one Cell A placed region (e.g., 210E) having pin densities in the range larger than 0% but smaller than or equal to 20%. There are two Cell A placed regions (e.g., 210A and 210C) having pin densities in the range larger than 50% but smaller than or equal to 60. There is one Cell A placed region (e.g., 210H) having pin densities in the range larger than 60% but smaller than or equal to 70%. There are two Cell A (e.g., 210G) placed regions having pin densities in the range larger than 90% but smaller than or equal to 100%. In the table of FIG. 2E, the nine bins (listed in the first column) constitute nine pin density features for characterizing any given cell, and the counted number of the given cell in each of the nine bins (listed in the second column) is a score value for the corresponding one of the nine pin density features.

In FIG. 2D, a group of nine regions is selected for counting the numbers of a given cell in each region. In other embodiments, a group of more or less than nine regions is selected for counting the numbers of a given cell in each region. In FIG. 2D, each of the nine regions is in an N×N window, where N (such as 10) is a size measured in terms of a number of the standard cell height. In some embodiments, each region in a group of multiple regions is in an N×M window, and N is different from M, where each of N and M is a size measured in terms of a number of the standard cell height. Additionally, the selection of lower bound and upper bound of each bin in FIG. 2E are provided as examples. Lower bounds and upper bounds of bins other than what are shown in FIG. 2E are within the contemplated scope of the present disclosure.

In some embodiments of the method in FIG. 1, the set of features for characterizing a group of cells includes one or more placement density features. The placement density features provide information about whether DRC violations are correlated with the placement of a cell in high placement density regions of the design. In some embodiments, the placement density features for characterizing a given cell is related to a distribution of the given cell among regions of various placement densities. In some embodiments, for generating a representation of a placement density distribution of a given cell, a group of regions with various placement densities (such as 20%, 40%, . . . , or 90%) is selected for counting the numbers of the given cell in each region. Additionally, multiple bins each representing a range of placement densities are selected to summarize the counted number of the given cell in various regions.

In some embodiments, a table with two columns are generated for representing a placement density distribution of a given cell. In the table, the multiple bins (listed in the first column) constitute multiple pin density features for characterizing any given cell, and the counted number of the given cell in each of the multiple bins (listed in the second column) is a score value for the corresponding one of the multiple pin density features. In some embodiments, the process of generating the table for representing a placement density distribution is similar to the process of generating the table for representing a pin density distribution (such as counting the numbers of cell A in each of the nine regions as shown in FIG. 2D and summarizing the counted number of cell A in a table like the table in FIG. 2E.). The selection of nine bins in FIG. 2D is provided as an example. In other embodiments, more than nine bins or less than nine bins are selected for characterizing the cell statistics of the pin densities. The selection of lower bound and upper bound of each bin in FIG. 2E are also provided as examples. Lower bounds and upper bounds of bins other than what are shown in FIG. 2E are within the contemplated scope of the present disclosure.

In some embodiments of the method in FIG. 1, the set of features for characterizing a group of cells includes two usage related features, which are cell usage by area and cell usage by count. The two usage related features are included in the set of features for characterizing a group of cells, because the quantity of the usages of a given cell impacts how critical the given cell is in the overall design. The cell usage by area, when expressed as a percentage, is given by the following equation:

$$\text{cell usage by area} = \frac{\text{cell type area}}{\text{total cell area}} \times 100$$

The cell usage by count, when expressed as a percentage, is given by the following equation:

$$\text{cell usage by count} = \frac{\text{cell type count}}{\text{total cell count}} \times 100$$

In some embodiments of the method in FIG. 1, the set of features for characterizing a group of cells includes two cell intrinsic features, which are individual cell pin count and individual cell pin density. In some embodiments, the individual cell pin count is the sum total of all the signal pins in the cell, while the individual cell pin density is the ratio of pin count to individual cell area measured in the unit of per square micrometers.

Returning to the method of FIG. 1, the process 120 involves obtaining relevant features and relevant cell data. In some embodiments, the cell data is represented by a data matrix of dimensions N×M, where N is the number of cells in a design obtained from an APR database and M is the number of features extracted for each cell. In one specific example, when the set of features for characterizing the cells in a design is represented by a list of twenty five elements (e.g., the features as shown in the Table of FIG. 3), and when the number of cells in the design is 600, the cell data is represented by a data matrix of dimensions 600×25.

In some embodiments, during the process 120 of obtaining relevant features and relevant cell data, data related to any cells which were not used in a target design is removed. In some embodiments, during the process 120, features that do not convey relevant information are removed from the set of features for characterizing the cells. For example, a feature which has the same value for every cell type is not useful for distinguishing characteristics of different cells, and hence this feature is removed from the set of features for use in further processes (e.g., 140, 150, and 160) in FIG. 1. In some embodiments, during the process 120, some highly correlated features are removed from the set of features for using in further processes, because the highly correlated features convey redundant information. In some embodiments, any feature which has more than 95% correlation with another feature of the same feature category is removed.

In FIG. 1, after relevant features and relevant cell data are obtained (at process 120), a list of prioritized features is generated (at process 300). In some embodiments, the list of prioritized features is generated from a set of features for characterizing a group of cells. FIG. 3 is a table of a set of features for characterizing a group of cells, in accordance with some embodiments. In FIG. 3, the set of features for characterizing a group of cells includes twenty five features organized into five categories of features. The five categories of features are listed in order of priority and appears in the following sequence: the DRC features, the pin density features, the placement density features, the usage related features, and the cell intrinsic features. The set of features for characterizing a group of cells is identified by a list of twenty five features. In some embodiments, greater or lesser number of features and/or elements are used to characterize cells. Each element F(i) in the list of twenty five elements corresponds to one of the twenty five features (where the index i=1, 2, 3, . . . , or 25).

In the table of FIG. 3, there are three DRC features: the feature of on-top DRC markers, the feature of adjacent- to DRC markers, and the feature of nearest-neighbor-to DRC markers, which correspond to features F(1), F(2), and F(3). In the table, there are nine pin density features corresponding to features F(4)-F(12) and nine placement density features corresponding to features F(13)-F(21). In the table, there are two usage related features: cell usage by area and cell usage by count, which correspond to features F(22) and F(23). In the table, there are two cell intrinsic features: individual cell pin density and individual cell pin count, which correspond to F(24) and F(25).

In the table of FIG. 3, the five categories of features are listed in order of priority, and consequently the list of the twenty five features in the table is at least partially prioritized. Specifically, each of the features F(1)-F(3) within the category of DRC features has a higher priority than any of the features F(4)-F(12) within the category of pin density features. Each of the features F(4)-F(12) has a higher priority than any of the features F(13)-F(21) within the category of placement density features. Each of the features F(13)-F(21) has a higher priority than any of the features F(22)-F(23) within the category of usage related features. Each of the features F(22)-F(23) has a higher priority than any of the features F(24)-F(25) within the category of cell intrinsic features.

Furthermore, in the table of FIG. 3, the features within each of the five categories of features are also listed in order of priority, and consequently the list of the twenty five features in the table constitutes a list of prioritized features. The features F(1), F(2), and F(3) are listed in a sequence with descending priority within the category of DRC features. The features F(4), F(5), F(6), F(7), F(8), F(9), F(10), F(11) and F(12) are listed in a sequence with descending priority within the category of pin density features. The features F(13), F(14), F(15), F(16), F(17), F(18), F(19), F(20) and F(21) are listed in a sequence with descending priority within the category of placement density features. The features F(22) and F(23) are listed in a sequence with descending priority within the category of usage related features. The features F(23) and F(24) are listed in a sequence with descending priority within the category of cell intrinsic features.

In some embodiments, a list of prioritized features is generated, from a set of features for characterizing a group of cells, based on domain specific knowledge. For example, for identifying critical cells to avoid DRC violations, it is expected that DRC related features should have one of the highest priorities, in accordance with some embodiments. In another example, because poor pin accessibility which eventually leads to DRC violations and because problematic cell layouts correlate with poor pin accessibility, it is expected that, in accordance with some embodiments, the maximal density bin (e.g., the 90-100% bin) should have the highest priority within the category of pin density features, while the minimal density bin (e.g., the 0-20% bin) should have the lowest priority within the category of pin density features. In this example, the assignment of priorities within the category of pin density features is understandable, because cells lying in higher pin density regions are more prone to routing issues.

In FIG. 1, after a list of prioritized features is generated (at process 300), feature vectors for the cells are generated (at process 140). In some embodiments, the feature vectors for the cells are generated based on a set of features for characterizing a group of cells, and the number of features in the set of features determines the dimension of each feature vector. In some embodiments, the set of features is represented by a list of prioritized features, and the number of features (say n for example) in the list of prioritized features determines the dimension of each feature vector. In some embodiments, each feature vector represents one cell and corresponds to an end point in an n-dimensional space. The end point coordinates of the feature vector for a given cell, in the n-dimensional space, are determined by the score values assigned to the features of the given cell. Each feature of the given cell is assigned one score value. For example, in some embodiments, the feature of on-top DRC markers of a given cell is assigned with a score value which is the number of times in a layout design the given cell falls directly on top of a DRC marker. In some embodiments, in the category of pin density features, the counted number of a given cell in the bins representing a range of pin densities (e.g., in the range from 80% to 90%) is assigned to the corresponding pin density feature of the given cell.

In some embodiments, the score value assigned to each feature of a cell is scaled with a corresponding proportional constant, before the feature vectors for the cells are used further in other processes (e.g., 150 or 160 in FIG. 1). In some embodiments, for determining the proportional constant of scaling a given feature, the standard deviation of the score value distribution of the given feature among all cells in a group is calculated, and the proportional constant is selected such that the score value distribution of the given feature after the scaling has a unit standard deviation. In some embodiments, each feature in a list of prioritized features is scaled such that each feature has a score value distribution of a unit standard deviation.

In FIG. 1, after the feature vectors for the cells are generated (at process 140), cells are partitioned into clusters (at process 150), and an output list of ranked critical cells is generated (at process 160) for providing to the user. Then, at process 170, cell layouts are adjusted by the user based on the ranked critical cells to reduce the number of DRC violations generated by Automated Place and Route (APR) tools. In some embodiments, the ranked critical cells in the output list of ranked critical cells are identified by cell names or cell ID, and each ranked critical cell is associated with a ranking number. In some embodiments, the ranked critical cells are displayed page by page on a computer screen or printed out in a printer. In some embodiments, the ranked critical cells are saved in an APR database. In some embodiments, the ranking numbers of the ranked critical cells are used to modify an existing APR database. For example, in some embodiments, if a given cell in the existing APR database is also a ranked critical cell in the output list of ranked critical cells, an existing APR database is modified by associating the given cell with a corresponding ranking number. In some embodiments, a ranked critical cell is provided to the user when queried by a ranking number.

In some embodiments, each cluster (generated at process 150) is assumed to represent a class of cells that share certain common characteristics. In some embodiments, each feature vector represents one cell and corresponds to a point in an n-dimensional space. A group of cells is represented by a group of points in the n-dimensional space. In some embodiments, cells are partitioned into clusters (at process 150) using a k-means clustering algorithm. The k-means clustering algorithm is a method of vector quantization, originally from signal processing, which is often used for cluster analysis in data mining. For data mining applications, the k-means clustering algorithm partitions n observations into k clusters in which each observation belongs to the cluster with the nearest mean, serving as a prototype of the cluster. When the group of points is divided into a predetermined number of clusters with a k-means clustering algorithm based on a distance function that is related to the distances between the points in the n-dimensional space, the group of cells is correspondingly divided into a same number of clusters. In some embodiments, the distance between two points in the n-dimensional space is the Euclidian distance.

Figure 4:
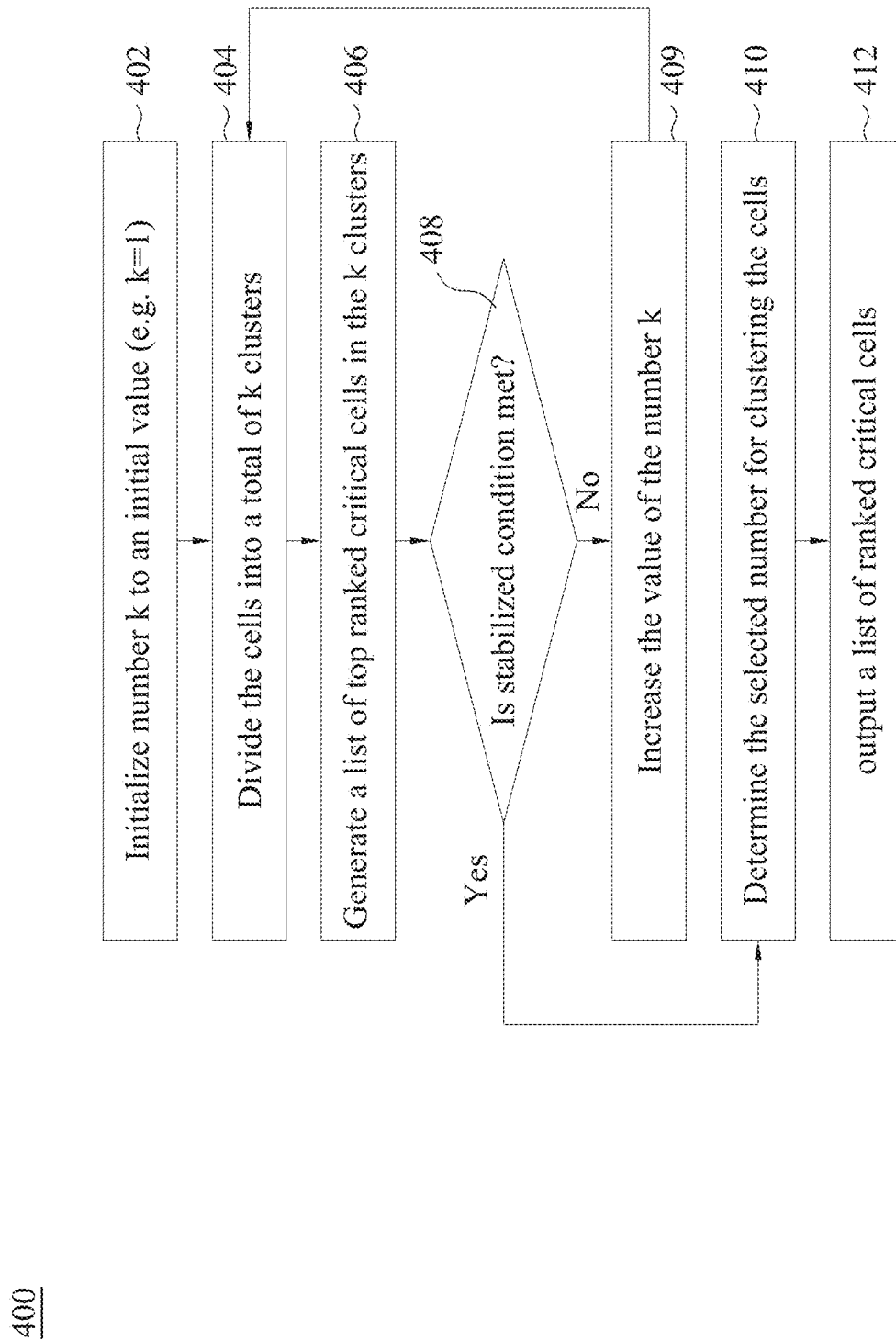
FIG. 4 is a flowchart of a method of determining a selected number of clusters for partitioning cells, in accordance with some embodiments.

In some embodiments, the number of clusters for using in the k-means clustering algorithm is provided by the user based on specific domain knowledge. In some embodiments, the number of clusters for partitioning the cells is determined based on other methods. FIG. 4 is a flowchart of a method of partitioning the cells into a selected number of clusters and determining the selected number during the process, in accordance with some embodiments. In FIG. 4, at the beginning of the method, the number of clusters that should be generated is unknown. For selecting the number of clusters that should be generated, a number k for specifying the number of clusters is initialized to an initial value (at process 402), and the cells are divided into a total of k clusters (at process 404). In some embodiments, the number k is initialized to one (e.g., k=1). The number k is increased (at process 409) multiple times during the iteration of the processes 404, 406, 408, and 409, until a stabilization condition is met. Then, at process 410, the number k when the stabilized condition is met becomes the selected number for clustering the cells, and the cells are partitioned into the selected number of clusters.

During each iteration of the processes 404, 406, 408, and 409, the cells are divided into k clusters (at process 404). In some embodiments, the cells are divided into k clusters (at process 404) based on the k-means clustering algorithm. At process 404, each cell corresponds to a feature vector and is represented by a point in an n-dimensional space. The collection of the points in the n-dimensional space is divided into k clusters (at process 404) based on the k-means clustering algorithm. Each cluster of points represents a cluster of the corresponding cells.

In FIG. 4, after the cells are divided into k clusters (at process 404), a list of top ranked critical cells in the k clusters is generated (at process 406). In some embodiments for generating the list of top ranked critical cells, a list of ranked critical cells is obtained from a cell ranking algorithm. A chosen number of critical cells in the top of the list are selected to form the list of top ranked critical cells. An example of the cell ranking algorithm for ranking the cells in k cluster is the method 700 in FIG. 7. In some embodiments, the list of top ranked critical cells includes five top most critical cells (i.e., the chosen number is five) in the list of ranked critical cells obtained from the cell ranking algorithm.

In FIG. 4, the list of top ranked critical cells is used at process 408 for determining whether a stabilized condition is met. If the stabilized condition is not met (as determined at process 408), the value of the number k will be increased (at process 409), and another iteration of the processes will start at the process 404 (in which the cells are divided into k clusters while the number k takes the new value obtained at process 409). In some embodiments, the number k of the clusters is represented by the value of the variable k, if the stabilized condition is not met (at process 408), the value of the variable k is increased (at process 409) by one (i.e., the value of k+1 is assigned to the variable k). Increasing the value of the variable k by an integer larger than one is also within the contemplated scope of the present disclosure. At process 408, if the stabilized condition is met, the method proceeds to process 410, and the latest value of the number k becomes the selected number for clustering the cells. In some embodiments, if the stabilized condition is met, an output list of ranked critical cells for providing to the user is generated (at process 412). In some embodiments, the output list of ranked critical cells (now including the selected number of clusters) is the list of ranked critical cells formed previously when ranking the cells in the k clusters.

In some embodiments for determining whether a stabilized condition is met (at process 408), a current list of ranked critical cells is generated during the process iteration with the number k, and a previous list of ranked critical cells is generated during the process iteration with the number k−1. The chosen number (e.g., five) of the top most critical cells are selected from the current list of ranked critical cells to form a first list of top ranked critical cells for the number k, and the chosen number (e.g., five) of the top most critical cells are selected from the previous list of ranked critical cells to form a second list of top ranked critical cells for the number k−1. In some embodiments, the stabilized condition is met when a comparison between the first list of top ranked critical cells for the number k and the second list of top ranked critical cells for a number k−1 indicates that the first list and the second list have identical critical cells. In some embodiments, the stabilized condition is met when a comparison between the first list of top ranked critical cells for the number k and the second list of top ranked critical cells for a number k−1 indicates that the first list and the second list have no more than a threshold number of different critical cells. For example, in some embodiments, to meet the stabilized condition, only one of the top (say 5 for example) ranked critical cells in the first list for the number k is allowed to be different form the top ranked critical cells in the second list for the number k−1. In some embodiments, to meet the stabilized condition, only two of the top (say 5 for example) ranked critical cells in the first list for the number k are allowed to be different form the top ranked critical cells in the second list for the number k−1.

In FIG. 4, at process 406, the list of top ranked critical cells is generated from the list of ranked critical cells obtained based on a cell ranking algorithm. In some embodiments, the method 700 of FIG. 7 is used to generate a list of ranked critical cells from a group of cells. The method 700 involves a method 500 of ranking clusters and a method 600 of ranking cells in a chosen cluster. Example embodiments of the method 500 and the method 600 are explained in more detail in connection with FIGS. 5A-5C and FIGS. 6A-6B.

Figure 5A:
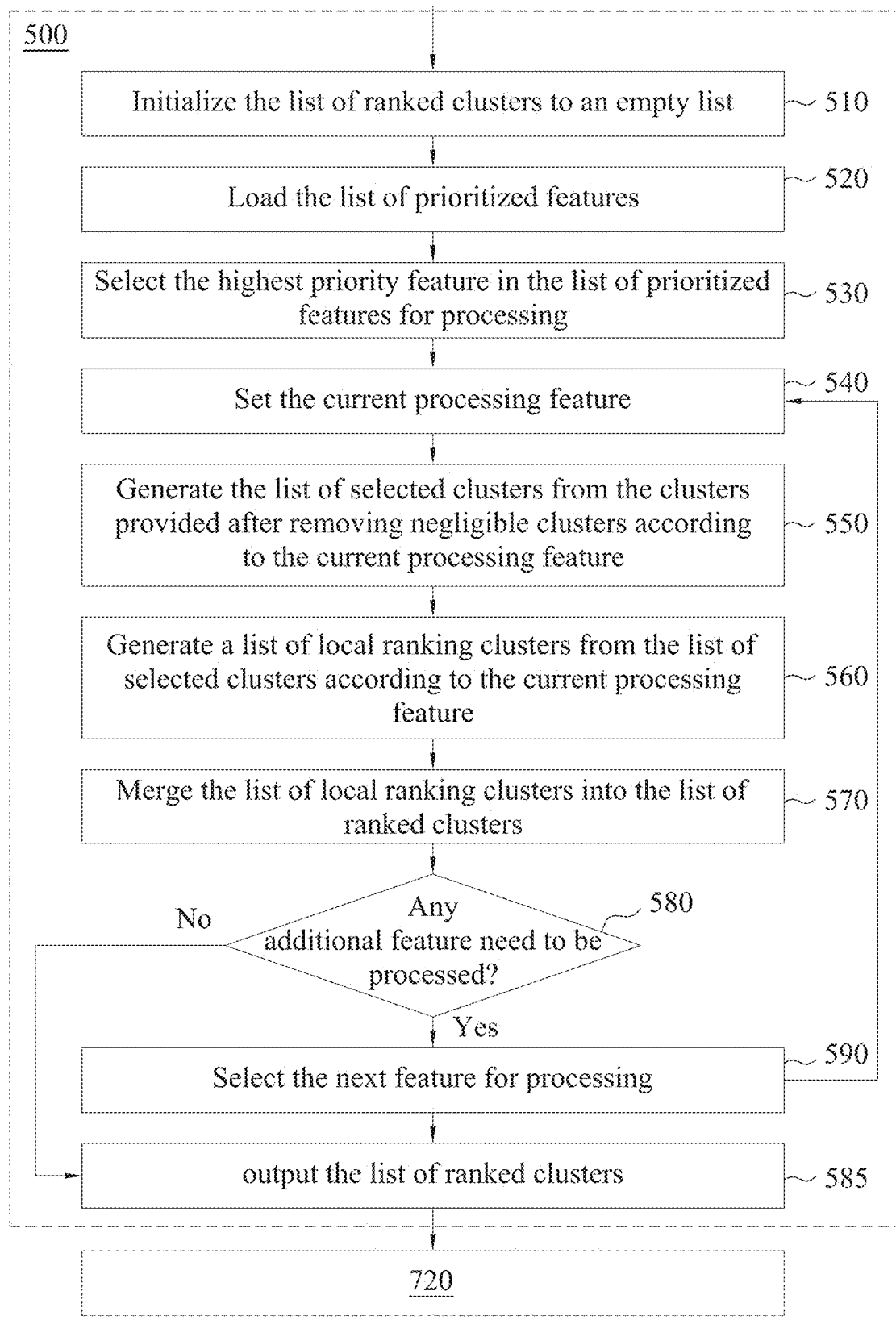
FIGS. 5A-5B are flowcharts of a method of generating a list of ranked clusters, in accordance with some embodiments.
Figure 5B:
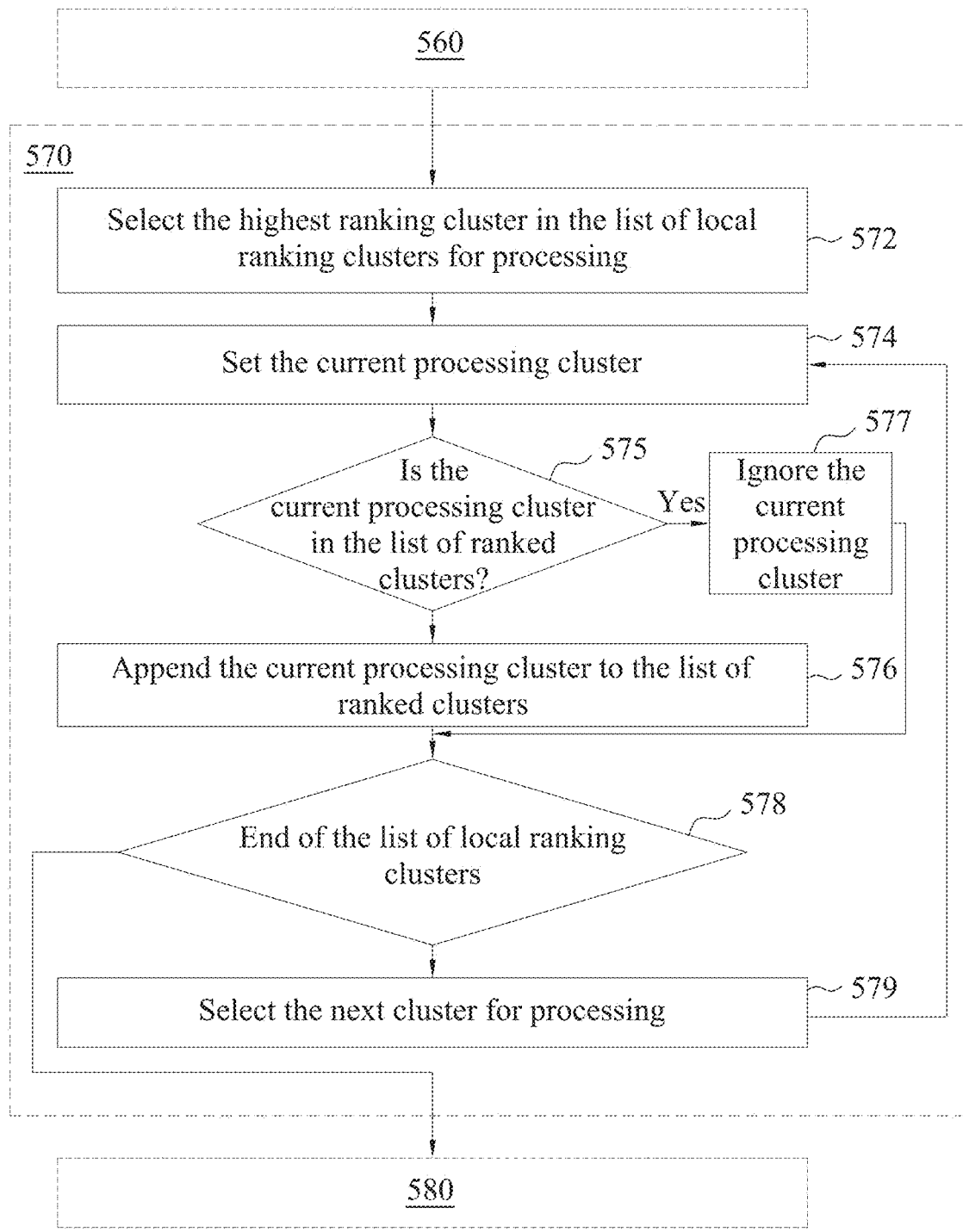
Figure 5C:
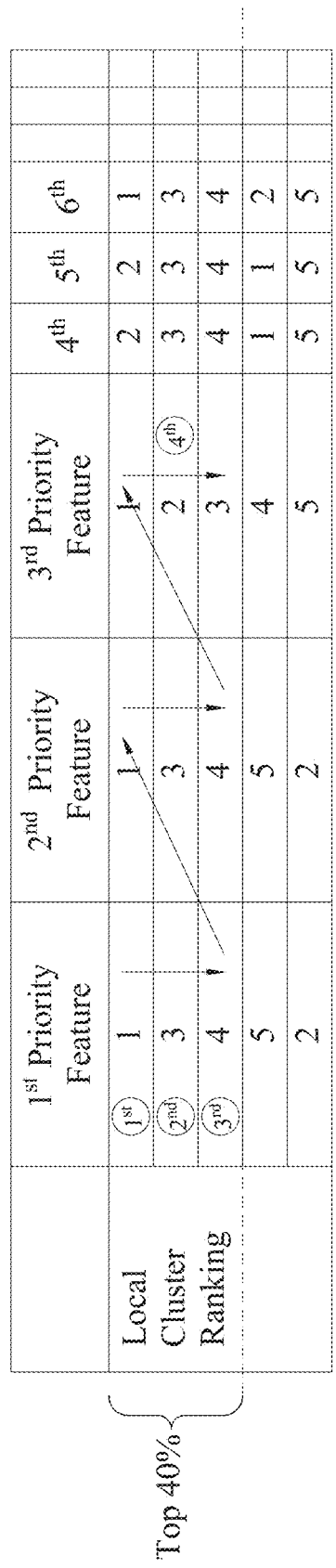
FIG. 5C is a table of cluster rankings, in accordance with some embodiments.

FIGS. 5A-5B are flowcharts of a method 500 of generating a list of ranked clusters, in accordance with some embodiments. The flowcharts of FIGS. 5A-5B are explained with reference to an example in FIG. 5C. FIG. 5C is a table of cluster rankings according to each of the top six features in a list of prioritized features, in accordance with some embodiments. In FIG. 5C, five clusters with ID 1, ID 2, ID 3, ID 4, and ID 5 are listed in each of the six columns in an order following the rankings according to a corresponding feature in the column. For example, when the five clusters are ranked according to the first priority feature, the five clusters are listed in the order of ID 1, ID 3, ID 4, ID 5, and ID 2 in the column corresponding to the first priority feature. When the five clusters are ranked according to the second priority feature, the five clusters are listed in the order of ID 1, ID 3, ID 4, ID 5, and ID 2 in the column corresponding to the second priority feature. When the five clusters are ranked according to the third priority feature, the five clusters are listed in the order of ID 1, ID 2, ID 3, ID 4, and ID 5 in the column corresponding to the third priority feature.

In the method 500, a list of ranked clusters is initialized to an empty list (at process 510), and a list of prioritized features is loaded (at process 520). In one example, the loaded list of prioritized features is the list of prioritized features as show in the table of FIG. 3. In FIG. 3, the top three features in the loaded list of prioritized features is the feature of on-top DRC markers, the feature of adjacent to DRC markers, and the feature of nearest neighbor to DRC markers. The highest priority feature selected at process 530 is the feature of on-top DRC markers.

In FIG. 5A, after a list of prioritized features is load (at process 520), the highest priority feature in the list of prioritized features is first select (at process 530) and set as the current processing feature (at process 540) for ranking clusters. The clusters obtained from a clustering process (such as the process 150 in FIG. 1 or the method 400 in FIG.

4) is analyzed to remove negligible clusters according to the current processing feature (at process 550). A given cluster is a negligible cluster when the score value of the given cluster for the current processing feature is below a threshold value. In some embodiments, the threshold value is selected as the score value at a top 40th percentile of all score values of all obtained clusters. All clusters having score values for the current processing feature below the 40th percentile are neglected for this selected feature. In the example of FIG. 5C, the first priority feature is the highest priority feature selected as the current processing feature. Because the score values of the clusters ID 5 and ID 2 for the first priority feature is below the 40th percentile, the clusters ID 5 and ID 2 are neglected.

In FIG. 5A, at process 550, after the negligible clusters are removed, a list of selected clusters is generated from the clusters provided. Next, at process 560, a list of locally ranked clusters is generated from the list of selected clusters according to the current processing feature. Then, at process 570, the list of locally ranked clusters is merged into the list of ranked clusters. The merging process 570 is described in more detail later with respect to FIG. 5B. Thereafter, if one or more features in the list of prioritized features need to be processed further (as determined at process 580), the next feature that immediately follows the current processing feature in terms of the priority is selected (at process 590), and the selected feature is set as the current processing feature (at process 540) for the next iteration. The iteration of the processes 540, 550, 560, and 580 is repeated until no more feature needs to be processed further. If no more feature in the list of prioritized features needs to be processed further (as determined at process 580), the method 500 proceeds to process 585 and the list of ranked clusters at the end of the last iteration is saved for output.

In some embodiments, during the process 560 of generating a list of locally ranked clusters according to a chosen priority feature, the score values assigned to the chosen priority feature for the clusters provided are compared with one another. In some embodiments, for calculating the score value of a chosen priority feature for a given cluster, the feature vector pointing to the center of mass for the given cluster is calculated by adding all feature vectors of the points (each representing a cell) in the n-dimensional space together to obtain a summation and dividing the summation by the number of points in the given cluster. The score value of the chosen priority feature for the given cluster is determined from a coordinate component of the feature vector pointing to the center of mass for the given cluster.

In FIG. 5A, at processes 550 and 560, the negligible clusters are removed and the list of locally ranked clusters is generated. As an example, the processes 550 and 560 are explained with reference to FIG. 5C. In FIG. 5C, after the clusters with the ID 5 and ID 2 are removed, the list of locally ranked clusters according to the first priority feature includes clusters listed in the order of cluster ID 1, cluster ID 3, and cluster ID 4. In the second iteration, after the clusters with the ID 5 and ID 2 are removed, the list of locally ranked clusters according to the second priority feature includes clusters listed in the order of cluster ID 1, cluster ID 3, and cluster ID 4. In the third iteration, after the clusters with the ID 4 and ID 5 are removed, the list of locally ranked clusters according to the third priority feature includes clusters listed in the order of cluster ID 1, cluster ID 2, and cluster ID 3.

In FIG. 5A, the process 570 is performed after a list of locally ranked clusters for the current processing feature is generated (at process 560) in each iteration. FIG. 5B is a flowchart of a detail of process 570 of merging a list of locally ranked clusters (according to any one priority feature) into a list of ranked clusters (taking into consideration priority of features), in accordance with some embodiments. In FIG. 5B, each cluster is taken from the list of locally ranked clusters and individually merged into the list of ranked clusters. The highest ranking cluster in the list of locally ranked clusters is select first for processing (at process 572) and is set as the current processing cluster (at process 574). If the current processing cluster is not in the list of ranked clusters (as determined at process 575), the current processing cluster is appended to the list of ranked clusters (at process 576), and the process 570 proceeds to process 578. If the current processing cluster is already in the list of ranked clusters (as determined at process 575), then, the current processing cluster is ignored (at process 577), and the process 570 proceeds to process 578.

In FIG. 5A, after the current processing cluster is processed at process 576 or process 577, if the current processing cluster is not at the end in the list of locally ranked clusters (as determined at process 578), the next cluster that immediately follows the current processing cluster in the list in terms of the ranking is selected (at process 579). The selected cluster (at process 579) is set as the current processing feature (at process 574) for the next iteration. The iteration (involving the process 574, process 575, one of processes 576 or 577, and process 578) is repeated until every cluster in the list of locally ranked clusters is processed. After the last cluster in the list of locally ranked clusters is processed (as determined at process 578), the process 570 exits. In some embodiments, the process 570 is followed by process 580 in FIG. 5A.

As an example, the method 500 in FIG. 5A and the process 570 in FIG. 5B is explained with reference to FIG. 5C. In FIG. 5C, during a first iteration, a first list of locally ranked clusters according to the first priority feature is merged into the list of ranked clusters which is initially an empty list; therefore, in the list of ranked clusters after merging with the first list, the first element is cluster ID 1, the second element is cluster ID 3, and the third element is cluster ID 4. Then, during a second iteration, a second list of locally ranked clusters according to the second priority feature is merged into the list of ranked clusters. Because cluster ID 1, cluster ID 3, and cluster ID 4 in the second list are already in the list of ranked clusters, the merging of the second list into the list of ranked clusters does not modify the list of ranked clusters. Next, during a third iteration, a third list of locally ranked clusters according to the third priority feature is merged into the list of ranked clusters. Because cluster ID 2 in the third list is not in the list of ranked clusters, cluster ID 2 is appended to the list of ranked clusters as the fourth element. The list of ranked clusters after merging with the third list includes clusters listed in the order of ID 1, ID 3, ID 4, and ID 2. Similarly, the list of locally ranked clusters according to each of other priority features (e.g., the fourth priority feature, the fifth priority feature, and the six priority feature) are merged into the list of ranked clusters. After the last list of locally ranked clusters in the list of ranked clusters is merged into the list of ranked clusters, the list of ranked clusters is ready to be used by other process (e.g. process 580).

The method 700 of generating the list of ranked critical cells involves both method 500 of generating a list of ranked clusters and method 600 of generating a list of ordered cells in a given cluster. While the method 500 is described with reference to FIGS. 5A-5C, the method 600 is described in the following with reference to FIGS. 6A-B.

Figure 6A:
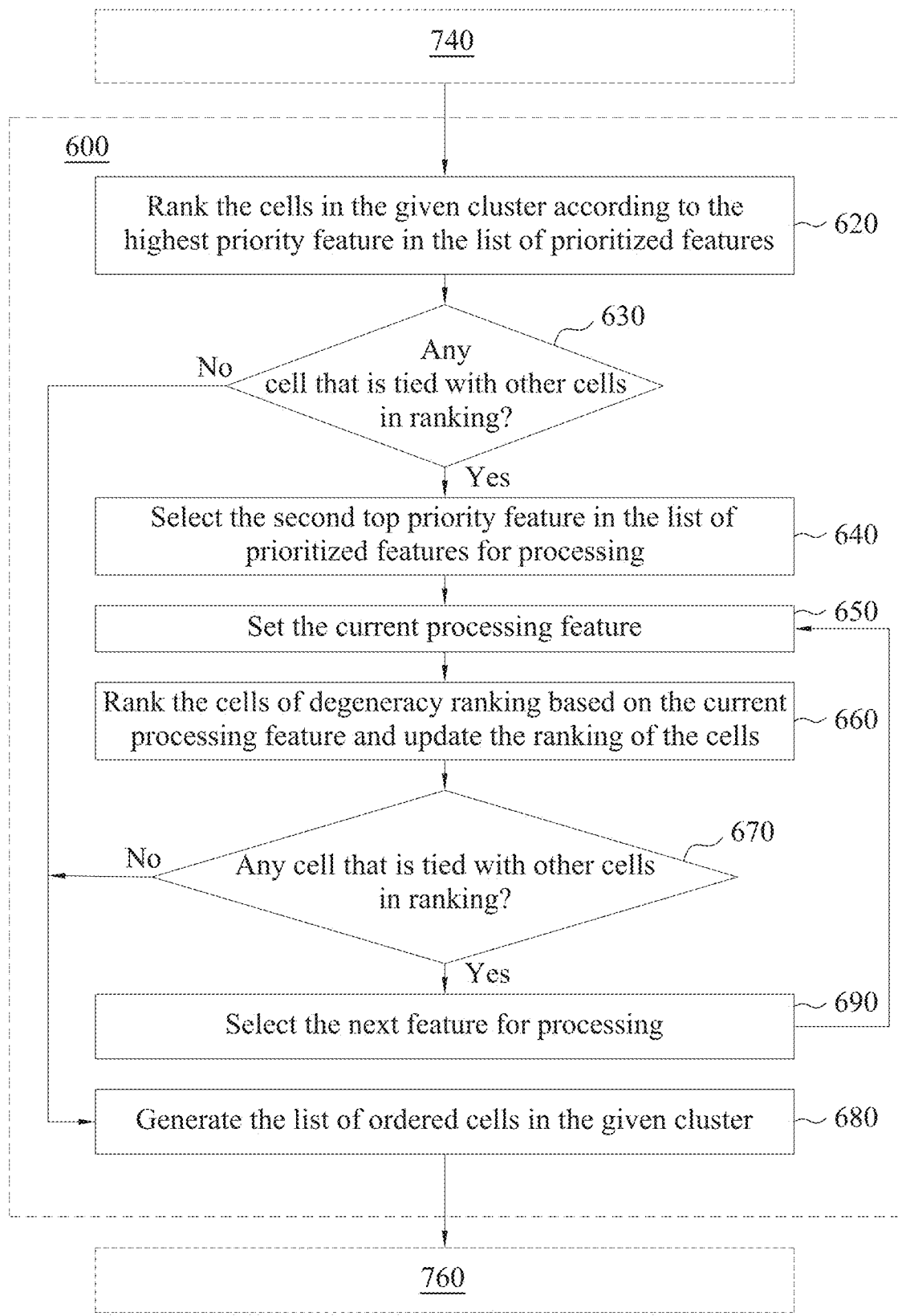
FIG. 6A is a flowchart of a method of generating a list of ordered cells in a given cluster, in accordance with some embodiments.
Figure 7:
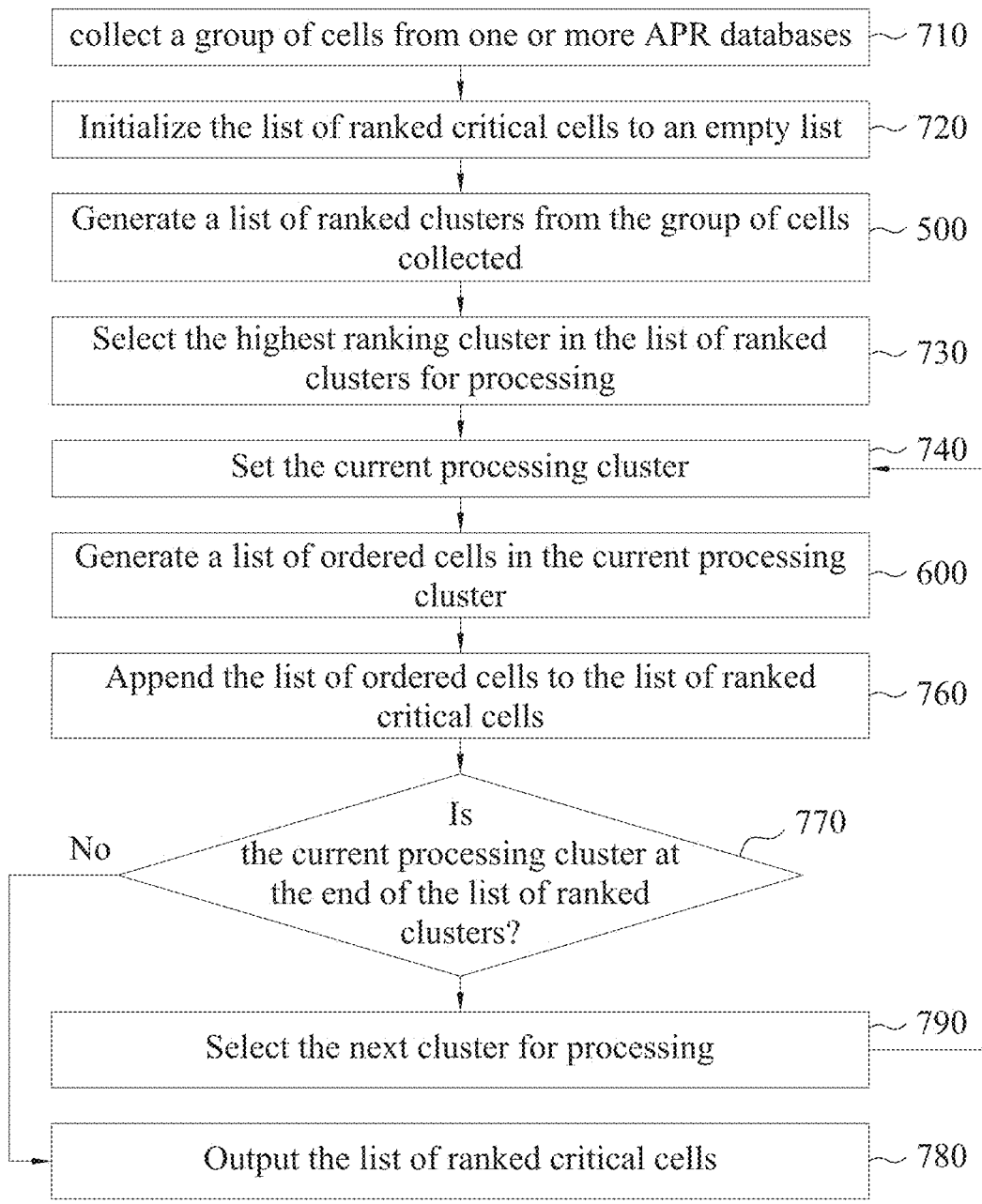
FIG. 7 is a flowchart of a method of generating a list of ranked critical cells, in accordance with some embodiments.

FIG. 6A is a flowchart of a method 600 of generating a list of ordered cells in a given cluster, in accordance with some embodiments. The flowchart of FIG. 6A is explained with reference to an example in FIG. 6B. FIG. 6B is a table listing the score values of the cells assigned to each of the top three priority features, in accordance with some embodiments. A first column lists the score values assigned to the first priority feature of the cells, a second column lists the score values assigned to the second priority feature of the cells, and a third column lists the score values assigned to the third priority feature of the cells. Additional columns are provided for listing the score values assigned to other priority features (e.g., the fourth feature, the fifth feature, and the sixth feature) of the cells.

In the example of FIG. 6B, the score values assigned to the first priority feature of Cell A, Cell B, Cell C, Cell D, Cell E, and Cell F are correspondingly 10, 8, 8, 4, 4, and 4. The score values assigned to the second priority feature of Cell A, Cell B, Cell C, Cell D, Cell E, and Cell F are correspondingly 5, 2, 6, 8, 8, and 7. The score values assigned to the third priority feature of Cell A, Cell B, Cell C, Cell D, Cell E, and Cell F are correspondingly 6, 7, 3, 6, 4, and 9.

In FIG. 6A, at process 620, the cells in a given cluster is ranked according to the highest priority feature in the list of prioritized features. If there is no cell that is tied with other cells in ranking (as determined at process 630), the list of ordered cells in the given cluster is generated (at process 680) from the ranking of the cells. If some cells are tied with others in ranking (as determined at process 630), the second top priority feature in the list of prioritized features is select (at process 640) and set as the current processing feature (at process 650). Then, at process 660, the cells that are tied with others are ranked based on the current processing feature, and the ranking of the cells is updated. The updated ranking of the cells is checked again for ties in ranking (at process 670). If there is no cell that is tied with other cells in ranking, the list of ordered cells in the given cluster is generated (at 680) from the updated ranking of the cells. If some cells are still tied with others in ranking (as determined at process 670), the next feature that immediately follows the current processing feature in terms of the priority is selected (at process 690), and the selected feature is set as the current processing feature (at process 650) for the next iteration. The iteration of the processes 650, 660, and 670 is repeated until there is no cell that is tied with other cells in ranking.

As an example, the method 600 in FIG. 6A is explained with reference to FIG. 6B. In FIG. 6B, the cells in a given cluster is ranked according to the first priority feature (which is the highest priority feature in the list of prioritized features). Cell A has the score value of 10 for the first priority, and ranked as the first element. Cell B and Cell C, each having the score value of 8 for the first priority, are ranked in the equal-ranking group consisting of the second element and the third element. Cell D, Cell E, and Cell F, each having the score value of 4 for the first priority, are ranked in the equal-ranking group consisting of the fourth element, the fifth element, and the sixth element.

When the ranking of the cells according to the first priority feature is checked for cells with equal ranking (e.g., at process 630 of FIG. 6), the second priority feature is selected for resolving the ranking of the cells with equal ranking. Cell B and Cell C are ranked according to the second priority feature (e.g., at process 660 of FIG. 6). Because the Cell B has the score value of 2 and the Cell C has the score value of 6, the Cell C is ranked as the second element and the Cell B is ranked as the third element. Cell D, Cell E, and Cell F are also ranked according to the second priority feature (e.g., at process 660 of FIG. 6). Because each of the Cell D and Cell E has the score value of 8 and the Cell F has the score value of 7, the Cell F is ranked as the sixth element while the Cell D and Cell E are ranked in the equal-ranking group consisting of the fourth element and the fifth element.

When the updated ranking of the cells after the processing of the second priority feature is checked for cells with equal ranking (e.g., at process 670 of FIG. 6), the third priority feature is selected (e.g., at process 690 of FIG. 6) for the next iteration to resolve the remaining tied ranking of the Cell D and Cell E. Cell D and Cell E are ranked according to the third priority feature (e.g., at process 660 of FIG. 6). Because the Cell D has the score value of 6 and the Cell E has the score value of 4, the Cell D is ranked as the fourth element and the Cell E is ranked as the fifth element. When the updated ranking of the cells after the processing of the third priority feature is checked for tied ranking (e.g., at process 670 of FIG. 6), there is no tied ranking among Cell A, Cell B, Cell C, Cell D, Cell E, and Cell F, and the list of ordered cells in the given cluster is generated (e.g., at process 680 of FIG. 6) from the updated ranking of the cells. The list of ordered cells includes cells listed in the order of Cell A, Cell C, Cell B, Cell D, Cell E, and Cell F.

In some embodiments, in the method 700 in FIG. 7, the method 500 in FIG. 5 is used for ranking clusters and the method 600 in FIG. 6 is used for ranking cells in a given cluster. FIG. 7 is a flowchart of the method 700 of generating a list of ranked critical cells from cells obtained from one or more APR databases, in accordance with some embodiments. In FIG. 7, a group of cells is collected (at process 710) from one or more APR databases, and a list of ranked critical cells is initialized to an empty list (at process 720). Then, as a result of method 500, a list of ranked clusters is generated from the group of cells collected. A flowchart of the method 500 in accordance with some embodiments is shown in FIG. 5. Thereafter, the highest ranking cluster in the list of ranked clusters is selected (at process 730) and set as the current processing cluster (at process 740). Then, as a result of method 600, a list of ordered cells in the current processing cluster is generated. A flowchart of the method 600 in accordance with some embodiments is shown in FIG. 6. Next, at process 760, the list of ordered cells in the current processing cluster is appended to the list of ranked critical cells.

After process 760, if the current processing cluster is not at the end in the list of ranked clusters (as determined at process 770), the next cluster that immediately follows the current processing cluster in the list of ranked clusters in terms of the ranking is selected (at process 790). The selected cluster (at process 790) is set as the current processing feature (at process 740) for the next iteration. The iteration (involving the process 740, process 600, and process 760) is repeated until every cluster in the list of ranked clusters is processed. In each iteration, the cells in the current processing cluster is ordered (at process 600) and append to the list of ranked critical cells (at process 760). After the last cluster in the list of ranked clusters is processed (as determined at process 770), the list of ranked critical cells for output is generated (at process 780).

Figure 8:
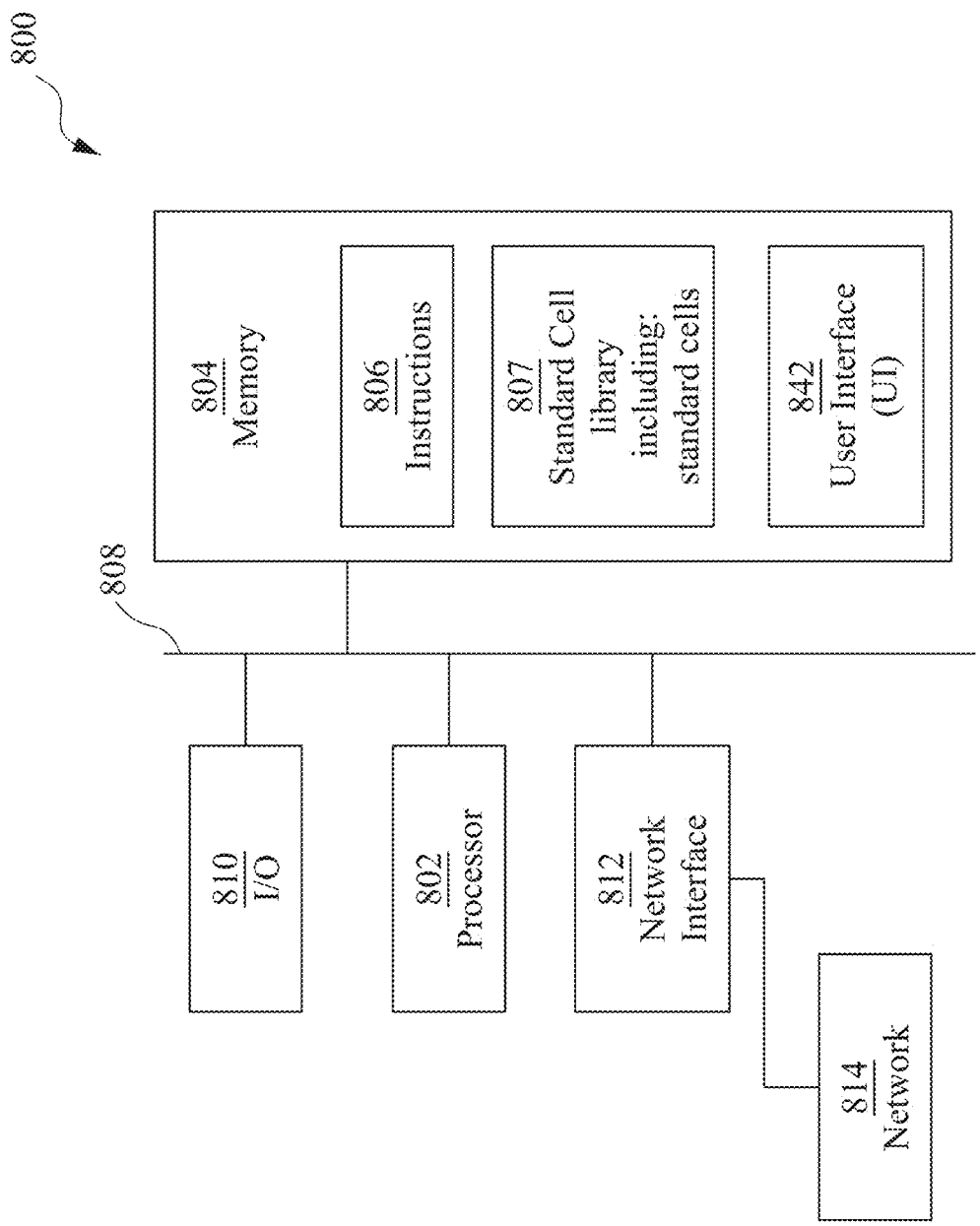
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an APR system. Methods described herein of designing layout diagrams represent wire routing arrangements, in accordance with one or more embodiments, are implementable, for example, using EDA system 800, in accordance with some embodiments.

In some embodiments, EDA system 800 is a general purpose computing device including a hardware processor 802 and a non-transitory, computer-readable storage medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of the methods described herein in accordance with one or more embodiments (hereinafter, the noted processes and/or methods).

Processor 802 is electrically coupled to computer-readable storage medium 804 via a bus 808. Processor 802 is also electrically coupled to an I/O interface 810 by bus 808. A network interface 812 is also electrically connected to processor 802 via bus 808. Network interface 812 is connected to a network 814, so that processor 802 and computer-readable storage medium 804 are capable of connecting to external elements via network 814. Processor 802 is configured to execute computer program code 806 encoded in computer-readable storage medium 804 in order to cause system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, storage medium 804 stores computer program code 806 configured to cause system 800 (where such execution represents (at least in part) the EDA tool) to be usable for performing a portion or all of the noted processes and/or methods. In one or more embodiments, storage medium 804 also stores information which facilitates performing a portion or all of the noted processes and/or methods. In one or more embodiments, storage medium 804 stores library 807 of standard cells including such standard cells as disclosed herein.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 also includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 800.

System 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a UI through I/O interface 810. The information is stored in computer-readable medium 804 as user interface (UI) 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
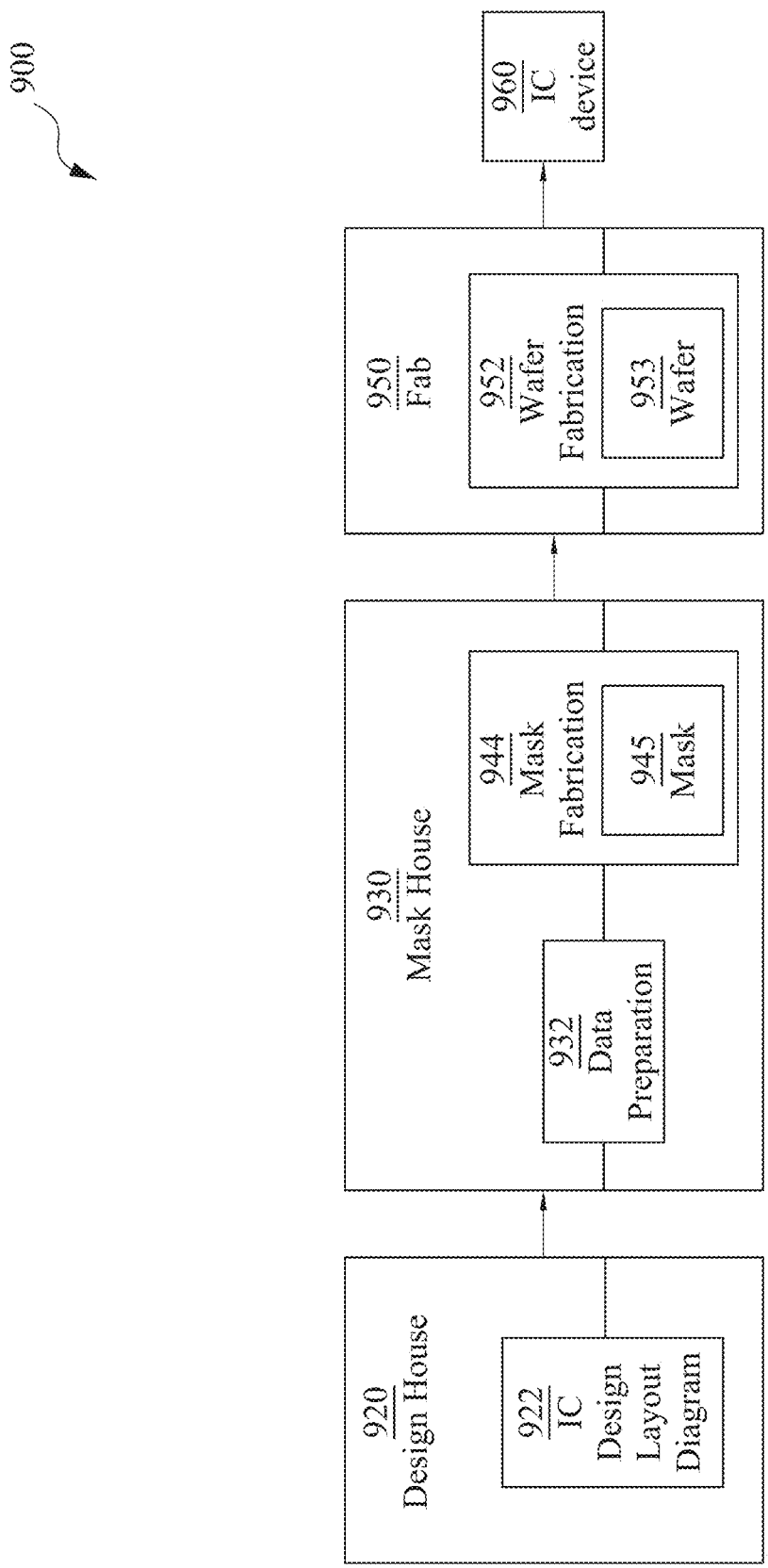
FIG. 9 is a block diagram of an integrated circuit (IC) manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout diagram 922. IC design layout diagram 922 includes various geometrical patterns designed for an IC device 960.

The geometrical patterns correspond to patterns of metal, oxide, or semiconductor layers that make up the various components of IC device 960 to be fabricated. The various layers combine to form various IC features. For example, a portion of IC design layout diagram 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout diagram 922. The design procedure includes one or more of logic design, physical design or place and route. IC design layout diagram 922 is presented in one or more data files having information of the geometrical patterns. For example, IC design layout diagram 922 can be expressed in a GDSII file format or DFII file format.

Mask house 930 includes data preparation 932 and mask fabrication 944. Mask house 930 uses IC design layout diagram 922 to manufacture one or more masks 945 to be used for fabricating the various layers of IC device 960 according to IC design layout diagram 922. Mask house 930 performs mask data preparation 932, where IC design layout diagram 922 is translated into a representative data file ("RDF"). Mask data preparation 932 provides the RDF to mask fabrication 944. Mask fabrication 944 includes a mask writer. A mask writer converts the RDF to an image on a substrate, such as a mask (reticle) 945 or a semiconductor wafer 953. The design layout diagram 922 is manipulated by mask data preparation 932 to comply with particular characteristics of the mask writer and/or requirements of IC fab 950. In FIG. 9, mask data preparation 932 and mask fabrication 944 are illustrated as separate elements. In some embodiments, mask data preparation 932 and mask fabrication 944 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout diagram 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout diagram 922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 922 to compensate for limitations during mask fabrication 944, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout diagram 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 922.

It should be understood that the above description of mask data preparation 932 has been simplified for the purposes of clarity. In some embodiments, data preparation 932 includes additional features such as a logic operation (LOP) to modify the IC design layout diagram 922 according to manufacturing rules. Additionally, the processes applied to IC design layout diagram 922 during data preparation 932 may be executed in a variety of different orders.

After mask data preparation 932 and during mask fabrication 944, a mask 945 or a group of masks 945 are fabricated based on the modified IC design layout diagram 922. In some embodiments, mask fabrication 944 includes performing one or more lithographic exposures based on IC design layout diagram 922. In some embodiments, an electron-beam (e-beam) or a mechanism of multiple e-beams is used to form a pattern on a mask (photomask or reticle) 945 based on the modified IC design layout diagram 922. Mask 945 can be formed in various technologies. In some embodiments, mask 945 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 945 includes a transparent substrate (e.g., fused quartz) and an opaque material (e.g., chromium) coated in the opaque regions of the binary mask. In another example, mask 945 is formed using a phase shift technology. In a phase shift mask (PSM) version of mask 945, various features in the pattern formed on the phase shift mask are configured to have proper phase difference to enhance the resolution and imaging quality. In various examples, phase shift mask can be attenuated PSM or alternating PSM. The mask(s) generated by mask fabrication 944 is used in a variety of processes. For example, such a mask(s) is used in an ion implantation process to form various doped regions in semiconductor wafer 953, in an etching process to form various etching regions in semiconductor wafer 953, and/or in other suitable processes.

IC fab 950 is an IC fabrication business that includes one or more manufacturing facilities for the fabrication of a variety of different IC products. In some embodiments, IC Fab 950 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 950 includes fabrication tools 952 configured to execute various manufacturing operations on semiconductor wafer 953 such that IC device 960 is fabricated in accordance with the mask(s), e.g., mask 945. In various embodiments, fabrication tools 952 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 950 uses mask(s) 945 fabricated by mask house 930 to fabricate IC device 960. Thus, IC fab 950 at least indirectly uses IC design layout diagram 922 to fabricate IC device 960. In some embodiments, semiconductor wafer 953 is fabricated by IC fab 950 using mask(s) 945 to form IC device 960. In some embodiments, the IC fabrication includes performing one or more lithographic exposures based at least indirectly on IC design layout diagram 922. Semiconductor wafer 953 includes a silicon substrate or other proper substrate having material layers formed thereon. Semiconductor wafer 953 further includes one or more of various doped regions, dielectric features, multi-level interconnects, and the like (formed at subsequent manufacturing steps).

Details regarding an integrated circuit (IC) manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to a method. The method includes clustering cells in a group of cells into a selected number of clusters, and ranking the clusters based on a list of prioritized features to generate a list of ranked clusters. The method also includes ranking cells in each of one or more ranked clusters in the list of ranked clusters, based on the list of prioritized features, to generate a list of ranked critical cells. The method further includes outputting the list of ranked critical cells for use in adjusting cell layouts based on the ranked critical cells.

Another aspect of this description relates to a computer program code stored on a non-transitory computer-readable medium. The computer program code is configured to cause a system having at least one processor to execute initializing a number k to an initial value, and repetitively generating an incremental value of the number k until a stabilized condition is met. The computer program code is also configured to cause the system to execute, for each value of the number k, clustering cells in a group of cells into a total of k clusters and generating a list of top ranked critical cells in the k clusters, and then ranking the k clusters based on a list of prioritized features to generate a list of ranked clusters. The computer program code is further configured to cause the system to execute generating a list of ranked critical cells in the list of ranked clusters, based on the list of prioritized features, and outputting the list of ranked critical cells for use in adjusting cell layouts based on ranked critical cells.

Still another aspect of this description relates to a computer program code stored on a non-transitory computer-readable medium. The computer program code is configured to cause a system having at least one processor to execute determining a selected number for clustering cells based on a list of prioritized features associated with a set of features, and clustering cells in a group of cells into the selected number of clusters. The computer program code is also configured to cause the system to execute ranking the clusters based on the list of prioritized features to generate a list of ranked clusters, and ranking cells in each of one or more ranked clusters in the list of ranked clusters, based on the list of prioritized features, to generate a list of ranked critical cells. The computer program code is further configured to cause the system to outputting the list of ranked critical cells for use in adjusting cell layouts based on ranked critical cells.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method comprising:
    clustering cells in a group of cells into a selected number of clusters, wherein each cluster includes at least two cells;
    ranking the clusters based on a list of prioritized features to generate a list of ranked clusters;
    ranking cells in each of one or more ranked clusters in the list of ranked clusters, based on the list of prioritized features, to generate a list of ranked critical cells;
    outputting the list of ranked critical cells for use in adjusting cell layouts based on the ranked critical cells; and
    clustering the cells in the group into the selected number of clusters based upon distances between end points of feature vectors.

2. The method of claim 1, wherein the group of cells is collected from an Auto Place and Route (APR) database that includes Design Rule Check (DRC) violations identified for at least a portion of cells in the APR database.

3. The method of claim 1, further comprising:
    obtaining a feature vector for each cell in the group of cells, wherein the feature vector for a cell includes a score value for each feature in a set of features selected for characterizing the group of cells.

4. The method of claim 3, wherein the feature vector for a cell includes one or more elements related to Design Rule Check (DRC) violations.

5. The method of claim 3, wherein the feature vector for a cell includes one or more elements related to a pin density of the cell.

6. The method of claim 3, wherein the feature vector for a cell includes one or more elements related to a placement density of the cell.

7. The method of claim 1, further comprising:
    determining the selected number for clustering the cells.

8. The method of claim 1, wherein the list of prioritized features includes DRC features and pin density features, wherein each of the DRC features has a higher priority than any of the pin density features.

9. The method of claim 1, wherein the list of prioritized includes DRC features, pin density features, and placement density features, wherein each of the DRC features has a higher priority than any of the pin density features, and wherein each of the pin density features has a higher priority than any of the placement density features.

10. The method of claim 9, wherein the list of prioritized features further includes usage related features, wherein each of the placement density features has a higher priority than any of the usage related features.

11. The method of claim 9, wherein the list of prioritized features further includes usage related features and cell intrinsic features, wherein each of the placement density features has a higher priority than any of the usage related features, and wherein each of the usage related features has a higher priority than any of the cell intrinsic features.

12. A computer program code stored on a non-transitory computer-readable medium, the computer program code is configured to cause a system having at least one processor to execute:
    initializing a number k to an initial value; and
    repetitively generating an incremental value of the number k until a stabilized condition is met, and for each value of the number k, clustering cells in a group of cells into a total of k clusters and generating a list of top ranked critical cells in the k clusters, wherein each cluster includes at least two cells;
    ranking the k clusters based on a list of prioritized features to generate a list of ranked clusters;
    generating a list of ranked critical cells in the list of ranked clusters, based on the list of prioritized features; and
    outputting the list of ranked critical cells for use in adjusting cell layouts based on ranked critical cells.

13. The computer program code of claim 12, wherein clustering the cells comprises:
    clustering the cells into a total of k clusters with a k-means clustering algorithm.

14. The computer program code of claim 12, wherein generating the list of top ranked critical cells in the k clusters comprises:
    generating a list of ranked critical cells in the k clusters based on a list of prioritized features associated with a set of features; and
    selecting a predetermined number of top ranked critical cells from the list of ranked critical cells to form the list of top ranked critical cells.

15. The computer program code of claim 12, wherein the stabilized condition is met when a comparison between a first list of top ranked critical cells for the number k and a second list of top ranked critical cells for a number k−1 indicates that the first list and the second list have identical critical cells.

16. The computer program code of claim 12, wherein the stabilized condition is met when a comparison between a first list of top ranked critical cells for the number k and a second list of top ranked critical cells for a number k−1 indicates that the first list and the second list have no more than a threshold number of different critical cells.

17. A computer program code stored on a non-transitory computer-readable medium, the computer program code is configured to cause a system having at least one processor to execute:
    determining a selected number for clustering cells based on a list of prioritized features associated with a set of features;
    clustering cells in a group of cells into the selected number of clusters, wherein each cluster includes at least two cells;
    ranking the clusters based on the list of prioritized features to generate a list of ranked clusters;
    ranking cells in each of one or more ranked clusters in the list of ranked clusters, based on the list of prioritized features, to generate a list of ranked critical cells;
    outputting the list of ranked critical cells for use in adjusting cell layouts based on ranked critical cells; and
    clustering the cells in the group into the selected number of clusters based upon distances between end points of feature vectors.

18. The computer program code of claim 17, wherein determining the selected number for clustering cells comprises:
    initializing a number k to an initial value;
    repetitively generating an incremental value of the number k until a stabilized condition is met, and for each value of the number k, clustering the cells into a total of k clusters and generating a list of ranked critical cells in the k clusters; and
    determining the list of ranked critical cells in the selected number of clusters from the list of ranked critical cells in the k clusters when the stabilized condition is met.

19. The computer program code of claim 17, wherein the group of cells is collected from an Auto Place and Route (APR) database that includes Design Rule Check (DRC) violations identified for at least a portion of cells in the APR database.

20. The computer program code of claim 17, wherein the list of prioritized features includes DRC features, pin density features, placement density features, usage related features, or cell intrinsic features.

* * * * *